(12) United States Patent
Hayashi

(10) Patent No.: US 8,852,390 B2
(45) Date of Patent: Oct. 7, 2014

(54) SUBSTRATE PROCESSING APPARATUS

(75) Inventor: Daisuke Hayashi, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 1123 days.

(21) Appl. No.: 12/748,702

(22) Filed: Mar. 29, 2010

(65) Prior Publication Data
US 2010/0243167 A1 Sep. 30, 2010

Related U.S. Application Data

(60) Provisional application No. 61/242,603, filed on Sep. 15, 2009.

(30) Foreign Application Priority Data

Mar. 30, 2009 (JP) .................. 2009-081898

(51) Int. Cl.
*C23F 1/00* (2006.01)
*C23C 16/00* (2006.01)
*H01L 21/306* (2006.01)
*H01J 37/32* (2006.01)

(52) U.S. Cl.
CPC ..... *H01J 37/32577* (2013.01); *H01J 37/32568* (2013.01)
USPC .................. 156/345.47; 118/723 E

(58) Field of Classification Search
USPC ............... 156/345.43–345.47; 118/715, 722, 118/723 R, 723 E; 315/111.21
See application file for complete search history.

(56) References Cited

U.S. PATENT DOCUMENTS 5,919,332 A * 7/1999 Koshiishi et al. ........ 156/345.47
2004/0261712 A1 12/2004 Hayashi et al.

FOREIGN PATENT DOCUMENTS

| JP | 2002-343787 A | 11/2002 |
| JP | 2007-180596 A | 7/2007 |
| JP | 2008-252067 A | 10/2008 |
| WO | 03003437 A1 | 1/2003 |

OTHER PUBLICATIONS

"Anodizing". Obtained from http://en.wikipedia.org/wiki/Anodizing on Dec. 16, 2013.*

* cited by examiner

*Primary Examiner* — Maureen Gramaglia
(74) *Attorney, Agent, or Firm* — Pearne & Gordon LLP

(57) ABSTRACT

A substrate processing apparatus includes: a cylindrical shaped chamber configured to accommodate a substrate; a movable electrode capable of moving along a central axis of the cylindrical shaped chamber within the cylindrical shaped chamber; a facing electrode facing the movable electrode within the cylindrical shaped chamber; and an expansible/contractible partition wall connecting the movable electrode with an end wall on one side of the cylindrical shaped chamber. In the substrate processing apparatus, a high frequency power is applied to a first space between the movable electrode and the facing electrode, a processing gas is introduced thereto, and the movable electrode is not in contact with a sidewall of the cylindrical shaped chamber. At least one low dielectric member is provided in a second space between the movable electrode and the end wall on one side of the cylindrical shaped chamber.

9 Claims, 12 Drawing Sheets

10

10

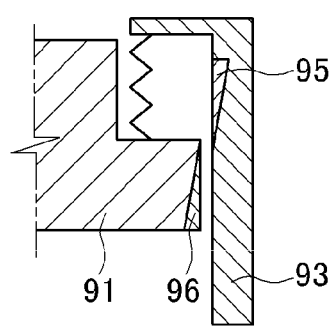
FIG. 11A
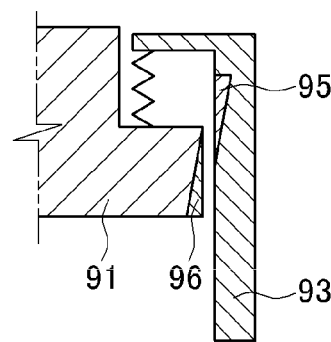
FIG. 11B
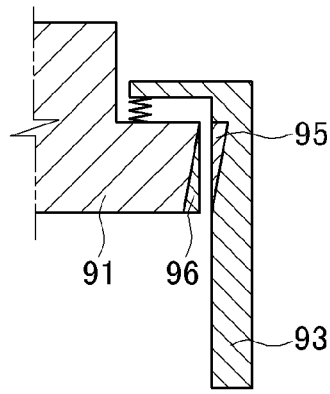
FIG. 11C
FIG. 11D
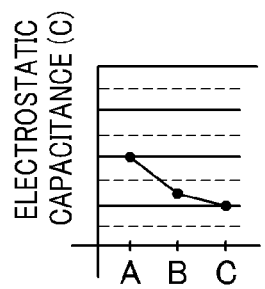

SUBSTRATE PROCESSING APPARATUS

CROSS-REFERENCE TO RELATED APPLICATION

This application claims the benefit of Japanese Patent Application No. 2009-081898 filed on Mar. 30, 2009, and U.S. Provisional Application Ser. No. 61/242,603 filed on Sep. 15, 2009, the entire disclosures of which are incorporated herein by reference.

FIELD OF THE INVENTION

The present disclosure relates to a substrate processing apparatus. In particular, the present disclosure relates to a substrate processing apparatus including a movable electrode in a processing chamber.

BACKGROUND OF THE INVENTION

A substrate processing apparatus, which performs a plasma process on a semiconductor wafer (hereinafter, simply referred to as "wafer") serving as a substrate, includes a chamber (processing chamber) that accommodates a wafer and can be depressurized; a susceptor positioned on the lower part within the chamber; and a shower head (upper electrode) provided within the chamber to face the susceptor. The susceptor is configured to mount thereon the wafer and serves as an electrode applying a high frequency power from a connected high frequency power supply into the chamber. The shower head introduces a processing gas into the chamber and is grounded to serve as a ground electrode. In this substrate processing apparatus, the processing gas supplied into the chamber is excited into plasma by the high frequency power and the wafer is plasma-processed by the plasma.

However, in order to appropriately distribute the plasma within the chamber, particularly, in a space between the shower head and the susceptor, there has been developed a substrate processing apparatus having a movable susceptor, thereby adjusting a thickness (hereinafter, referred to as a "gap") of a processing space between the shower head and the susceptor (see, for example, Patent Document 1). Besides, on account of the restriction on the layout around the substrate processing apparatus, a substrate processing apparatus having a movable shower head, not the movable susceptor, is recently under development.

FIG. 12 is a cross sectional view schematically illustrating a configuration of a substrate processing apparatus having a movable shower head.

In a substrate processing apparatus 100 of FIG. 12, a shower head 103 is installed within a cylindrical chamber 101 so as to face a susceptor 102. The shower head 103 is formed into a substantially circular plate shape having an outer diameter substantially the same as an inner diameter of the chamber 101. The shower head 103 is configured to vertically move like a piston in the chamber 101 by a non-illustrated lift mechanism. Further, installed between the shower head 103 and a ceiling portion of the chamber 101 is a bellows 104 expansible and contractible along with the vertical movement of the shower head 103. The bellows 104 seals the inside of the chamber 101 from its surrounding air. Furthermore, in FIG. 12, the shower head 103 at the lowermost position is indicated by a solid line, and the shower head 103 at the uppermost position is indicated by a dashed line.

Patent Document 1: Pamphlet of International Patent Publication No. WO03/003437 (FIG. 1)

However, this substrate processing apparatus 100 is configured to keep some gap between the shower head 103 and a sidewall 101b of the chamber 101, so that the shower head 103 smoothly moves up and down, thereby preventing generation of particles caused by a friction between the shower head 103 and the sidewall 101b. That is, since the shower head 103 is not in contact with the sidewall 101b, a direct current may not be flown from the shower head 103 to the sidewall 101b and an alternating current may be hardly flown from the shower head 103 to the sidewall 101b. Accordingly, in the substrate processing apparatus 100, a high frequency current caused by a high frequency power applied to the susceptor 102 flows through the susceptor 102, the processing space, the shower head 103, the bellows 104, a ceiling wall 101a of the chamber 101, and the sidewall 101b of the chamber 101 in sequence, as depicted by the arrow in FIG. 12.

The bellows 104 is made of stainless steel for increasing durability and has higher impedance than that of the other parts (e.g., the chamber 101, the shower head 103, and the like) made of aluminum. Accordingly, a potential difference is generated along the bellows 104, to be specific, between the shower head 103 and the ceiling wall 101a of the chamber 101. Therefore, there are concerns that an electric field may be generated in a space (hereinafter, referred to as "upper space") US between the shower head 103 and the ceiling wall 101a.

This electric field ionizes a processing gas introduced into the upper space US from the gap, so that plasma is generated. However, there is a problem in that the plasma generated in the upper space US erodes wall surfaces of the chamber 101 or the shower head 103, and forms a deposit.

BRIEF SUMMARY OF THE INVENTION

In view of the foregoing, the present disclosure provides a substrate processing apparatus capable of preventing generation of plasma in a space between a movable electrode and an end wall on one side of a cylindrical shaped chamber.

In order to solve the above-mentioned problem, in accordance with one aspect of the present disclosure, there is provided a substrate processing apparatus including a cylindrical shaped chamber configured to accommodate a substrate; a movable electrode capable of moving along a central axis of the cylindrical shaped chamber within the cylindrical shaped chamber; a facing electrode facing the movable electrode within the cylindrical shaped chamber; and an expansible/contractible partition wall connecting the movable electrode with an end wall on one side of the cylindrical shaped chamber. In the substrate processing apparatus, a high frequency power is applied to a first space between the movable electrode and the facing electrode, a processing gas is introduced thereto, and the movable electrode is not in contact with a sidewall of the cylindrical shaped chamber. At least one low dielectric member is provided in a second space between the movable electrode and the end wall on one side of the cylindrical shaped chamber.

Further, in the substrate processing apparatus, the low dielectric member may be provided on at least one of the movable electrode and the end wall on one side of the cylindrical shaped chamber.

In the substrate processing apparatus, a dielectric constant of the low dielectric member may be about 10 or less.

In the substrate processing apparatus, the low dielectric member may be made of polytetrafluoroethylene (PTFE), a copolymer of tetrafluoroethylene and perfluoroalkyl vinyl ether (PFA) or polychlorotrifluoroethylene (PCTFE).

Furthermore, in the substrate processing apparatus, another dielectric member may be further installed between the sidewall of the cylindrical shaped chamber and the movable electrode.

In the substrate processing apparatus, a thickness of the another dielectric member may be equal to or greater than about 5 mm in a direction from the movable electrode to the sidewall.

In the substrate processing apparatus, the another dielectric member may be made of ceramic.

In the substrate processing apparatus, the another dielectric member may be installed at the movable electrode.

In the substrate processing apparatus, the another dielectric member may be installed at the sidewall.

Further, in accordance with another aspect of the present disclosure, there is provided a substrate processing apparatus including a cylindrical shaped chamber configured to accommodate a substrate; a movable electrode capable of moving along a central axis of the cylindrical shaped chamber within the cylindrical shaped chamber; a facing electrode facing the movable electrode within the cylindrical shaped chamber; and an expansible/contractible partition wall connecting the movable electrode with an end wall on one side of the cylindrical shaped chamber. In the substrate processing apparatus, a high frequency power is applied to a first space between the movable electrode and the facing electrode, a processing gas is introduced thereto, and the movable electrode is not in contact with a sidewall of the cylindrical shaped chamber. Moreover, a first dielectric member is provided at the cylindrical shaped chamber's sidewall facing the movable electrode, and an overlap area between the first dielectric member and a side surface of the movable electrode is changed according to movement of the movable electrode.

In the substrate processing apparatus, a second dielectric member may be provided at the movable electrode's side surface facing the first dielectric member and an overlap area between the first dielectric member and the second dielectric member may be changed according to movement of the movable electrode.

In the substrate processing apparatus, in a cross section of the first dielectric member along a central axis of the cylindrical shaped chamber, a width in a direction orthogonal to the central axis may be constant along the central axis.

In the substrate processing apparatus, in a cross section of the first dielectric member along a central axis of the cylindrical shaped chamber, a width in a direction orthogonal to the central axis may be gradually changed along the central axis.

In the substrate processing apparatus, in a cross section of the second dielectric member along a central axis of the cylindrical shaped chamber, a width in a direction orthogonal to the central axis may be constant along the central axis.

In the substrate processing apparatus, in a cross section of the second dielectric member along a central axis of the cylindrical shaped chamber, a width in a direction orthogonal to the central axis may be gradually changed along the central axis.

In the substrate processing apparatus, each of the first dielectric member and the second dielectric member may be made of quartz, ceramic or an insulating resin.

In the above-mentioned substrate processing apparatus, at least one low dielectric member is provided in the second space between the movable electrode and the end wall on one side of the cylindrical shaped chamber. Thus, a voltage drop related to a high frequency current caused by the high frequency power applied to the first space and flowing through the movable electrode, the second space, the end wall on one side of the cylindrical shaped chamber, and the sidewall of this chamber can be shared by the low dielectric member. Accordingly, a voltage drop in the second space can be reduced and a potential difference in the second space can be reduced. As a result, it is possible to suppress generation of an electric field in the space (the second space) between the movable electrode and the end wall on one side of the cylindrical shaped chamber and further suppress generation of plasma therein.

In the substrate processing apparatus, the low dielectric member is provided on at least one of the movable electrode and the end wall on one side of the cylindrical shaped chamber, and, thus, the configuration of the substrate processing apparatus can be simplified. Accordingly, it is possible to easily assemble the substrate processing apparatus.

In the substrate processing apparatus, a dielectric constant of the low dielectric member is equal to or less than about 10. Therefore, it is possible to appropriately adjust a voltage drop to be shared by the low dielectric member.

In the substrate processing apparatus, the low dielectric member is made of polytetrafluoroethylene, a copolymer of tetrafluoroethylene and perfluoroalkyl vinyl ether or polychlorotrifluoroethylene. These materials have a high resistance to radicals, and, thus, even if a radical is introduced into the second space from the first space, it is possible to prevent the low dielectric member from being eroded. Further, it is easy to obtain these materials and, thus, the substrate processing apparatus can be easily manufactured, thereby reducing manufacturing cost.

Moreover, in the substrate processing apparatus, another dielectric member is further installed between the sidewall of the cylindrical shaped chamber and the movable electrode. Thus, the sidewall of the cylindrical shaped chamber can be spaced from the movable electrode, so that it is possible to prevent generation of abnormal electric discharge between the sidewall of the cylindrical shaped chamber and the movable electrode. Further, since a gap between the sidewall of the cylindrical shaped chamber and the movable electrode is filled up with the another dielectric member, it is possible to prevent plasma generated in the first space from being introduced into the second space.

In the substrate processing apparatus, a thickness of the another dielectric member is equal to or greater than about 5 mm in a direction from the movable electrode to the sidewall. Thus, it is possible to securely separate the sidewall of the cylindrical shaped chamber from the movable electrode.

In the substrate processing apparatus, the another dielectric member is made of ceramic. Even though the another dielectric member is in contact with the first space, ceramic has a high resistance to radicals and a high resistance to ion-sputtering. Therefore, it is possible to prevent the another dielectric member from being eroded by the plasma generated in the first space.

In the substrate processing apparatus, the another dielectric member is installed at the movable electrode. Thus, even if this movable electrode moves, the another dielectric member is always positioned between the sidewall of the cylindrical shaped chamber and the movable electrode. Therefore, it is possible to securely prevent generation of abnormal electric discharge.

In the substrate processing apparatus, the another dielectric member is installed at the sidewall, and, thus, a configuration of the movable electrode can be simplified.

In the substrate processing apparatus, the first dielectric member is provided at the cylindrical shaped chamber's sidewall facing the movable electrode, and the overlap area between the first dielectric member and the side surface of the movable electrode is changed according to movement of the movable electrode. Therefore, the electrostatic capacitance of an electrostatic coupling between the movable electrode, the first dielectric member, and the sidewall of the cylindrical shaped chamber is changed according to a change in the gap, and, thus, plasma distribution in the processing space according to the change in the gap can be optimized.

In the substrate processing apparatus, the second dielectric member is provided at the movable electrode's side surface facing the first dielectric member and the overlap area between the first dielectric member and the second dielectric member is changed according to movement of the movable electrode. Therefore, the electrostatic capacitance is finely changed, and, thus, plasma distribution in the processing space can be more finely adjusted according to the change in the gap.

In the cross section of the first or second dielectric member along the central axis of the cylindrical shaped chamber, the width in the direction orthogonal to the central axis is constant along the central axis. Therefore, the overlap area between the movable electrode and the first dielectric member or the overlap area between the first dielectric member and the second dielectric member is changed according to the change in the gap, and based on the change in the overlap area, the capacitance of the ground path of the high frequency current is changed. Accordingly, by adjusting a capacitance distribution ratio between the ground path and another ground path, plasma distribution in the processing space can be optimized.

In the cross section of the first or second dielectric member along the central axis of the cylindrical shaped chamber, the width in the direction orthogonal to the central axis is gradually changed along the central axis. Therefore, the overlap area between the movable electrode and the first dielectric member or the overlap area between the first dielectric member and the second dielectric member is changed according to the change in the gap, and based on the change in the overlap area and a change in the width of the first dielectric member and/or the second dielectric member in a direction orthogonal to the central axis, a capacitance of a ground path of the high frequency current is changed. Accordingly, by adjusting a capacitance distribution ratio between the ground path and the another ground path, plasma distribution in the processing space can be optimized.

In the substrate processing apparatus, each of the first dielectric member and the second dielectric member is made of quartz, ceramic or the insulating resin. Therefore, they have a resistance to ion-sputtering as well as a resistance to radicals, and, thus, the first dielectric member and the second dielectric member can be prevented from being eroded by plasma generated in the processing space.

BRIEF DESCRIPTION OF THE DRAWINGS

The disclosure may best be understood by reference to the following description taken in conjunction with the following figures:

FIGS. 11A to 11D are views of still another modified example of an electrostatic coupling between a shower head, a dielectric member, and a sidewall of a chamber in the third embodiment.

DETAILED DESCRIPTION OF THE INVENTION

Hereinafter, embodiments of the present invention will be described with reference to the accompanying drawings.

Above all, there will be explained a substrate processing apparatus in accordance with a first embodiment of the present invention.

Figure 1:
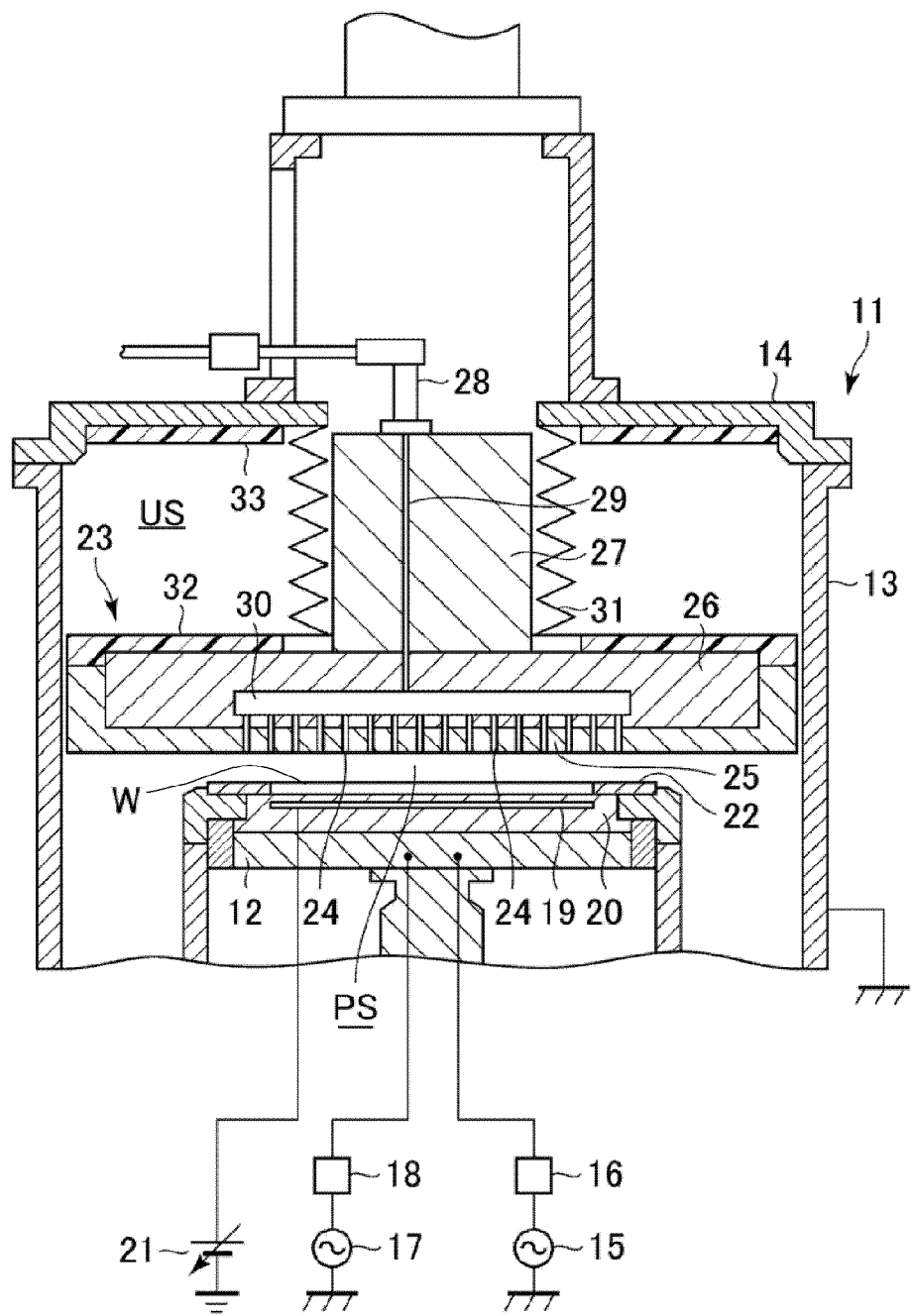
FIG. 1 is a schematic cross-sectional view of a substrate processing apparatus in accordance with a first embodiment of the present invention.

FIG. 1 is a schematic cross-sectional view of a substrate processing apparatus in accordance with the first embodiment. This substrate processing apparatus is configured to perform a dry etching process on a wafer.

As illustrated in FIG. 1, a substrate processing apparatus 10 includes a cylindrical chamber (cylindrical shaped vessel) 11 accommodating a wafer W of, e.g., about 300 mm in diameter. Further, a circular plate-shaped susceptor (facing electrode) 12 mounting thereon the wafer W for a semiconductor device is installed at the lower part of the chamber 11. The chamber 11 includes a circular pipe-shaped sidewall 13 and a circular plate-shaped cover (an end wall on one side of the cylindrical shaped vessel) 14 which covers an upper end of the sidewall 13.

The inside of the chamber 11 is depressurized by a TMP (Turbo Molecular Pump) and a DP (Dry Pump) (both not illustrated), and an internal pressure of the chamber 11 is controlled by an APC valve (not illustrated).

The susceptor 12 is connected with a first high frequency power supply 15 via a first matching unit 16 and with a second high frequency power supply 17 via a second matching unit 18. The first high frequency power supply 15 is configured to apply a high frequency bias power having a relatively low frequency of, e.g., about 3.2 MHz to the susceptor 12. The second high frequency power supply 17 is configured to apply a plasma-generating high frequency power having a relatively high frequency of, e.g., about 100 MHz to the susceptor 12. The susceptor 12 is configured to apply the plasma-generating power to the inside of the chamber 11.

Installed at the upper part of the susceptor 12 is an electrostatic chuck 20 including therein an electrostatic electrode plate 19. The electrostatic chuck 20 is made of a ceramic member having a circular plate shape, and the electrostatic electrode plate 19 is connected with a DC power supply 21. If a positive DC voltage is supplied to the electrostatic electrode plate 19, a negative potential is generated on the wafer W's surface (hereinafter, referred to as "rear surface") facing the electrostatic chuck 20. As a result, a potential difference is generated between the electrostatic electrode plate 19 and the rear surface of the wafer W. Accordingly, the wafer W is attracted to and held on the electrostatic chuck 20 by Coulomb force or Johnson-Rahbek force caused by the potential difference.

Further, a ring-shaped focus ring 22 is mounted on the susceptor 12 so as to surround the wafer W attracted to and held on the electrostatic chuck 20. The focus ring 22 is made of a conductive material such as single crystalline silicon which is the same material as that of the wafer W. Since the focus ring 22 is made of the conductive material, plasma can be distributed not only on the wafer W but also on the focus ring 22. Therefore, a plasma density on a peripheral portion of the wafer W can be maintained at the substantially same level as a plasma density on a central portion of the wafer W. Accordingly, it is possible to maintain uniformity of the dry etching process to be performed on the entire surface of the wafer W.

A shower head (movable electrode) 23 is installed to face the susceptor 12 at the upper part inside the chamber 11. The shower head 23 includes a conductive upper electrode plate 25 formed into a circular plate shape and having a plurality of gas holes 24; a cooling plate 26 attachably/detachably holding the upper electrode plate 25; a shaft 27 holding the cooling plate 26; and a processing gas container 28 positioned at the upper end of the shaft 27. The shower head 23 is grounded via the cover 14 and the sidewall 13 and serves as a ground electrode for a plasma-generating power applied to the inside of the chamber 11.

The shaft 27 includes a gas path 29 penetrating the inside of the shaft 27 in a vertical direction of the drawing, and the cooling plate 26 includes therein a buffer room 30. The gas path 29 connects the processing gas container 28 with the buffer room 30, and the buffer room 30 is communicated with the inside of the chamber 11 through each gas hole 24. In the shower head 23, the gas holes 24, the processing gas container 28, the gas path 29, and the buffer room 30 constitute a processing gas introducing unit. Further, this processing gas introducing unit introduces the processing gas supplied to the processing gas container 28 into the chamber 11, to be specific, to a processing space PS (a first space) between the shower head 23 and the susceptor 12.

Since an outer diameter of the upper electrode plate 25 of the shower head 23 is set to be a bit smaller than an inner diameter of the chamber 11, the shower head 23 is not in contact with the sidewall 13. That is, the shower head 23 is installed within the chamber 11 in a movable state. The shaft 27 penetrates the cover 14 and an upper portion of the shaft 27 is connected with a lift mechanism (not illustrated) positioned above the substrate processing apparatus 10. The lift mechanism is configured to move the shaft 27 in a vertical direction of the drawing. Here, the shower head 23 vertically moves along a central axis of the chamber 11 like a piston. Accordingly, a gap, i.e., a thickness of the processing space PS, between the shower head 23 and the susceptor 12 can be adjusted. The maximum moving distance of the shower head 23 in the vertical direction of the drawing is about 70 mm, for example.

Particles may be generated due to a friction between the shaft 27 and the cover 14. Therefore, a side surface of the shaft 27 is covered by, e.g., a bellows 31. The bellows is an expansible/contractible pressure partition wall made of, e.g., stainless steel. One end of the bellows 31 is joined to the cover 14 and the other end thereof is joined to the shower head 23. Further, the bellows 31 seals the inside of the chamber 11 from the outside of the chamber 11.

In the substrate processing apparatus 10, the processing gas supplied to the processing gas container 28 is introduced into the processing space PS through the processing gas introducing unit, and the introduced processing gas is excited into plasma by the plasma-generating power applied to the processing space PS. Positive ions in the plasma are attracted toward the wafer W mounted on the susceptor 12 by a negative bias potential caused by a bias power applied to the susceptor 12, and a dry etching process is performed on the wafer W.

The operations of respective components such as the first high frequency power supply 15 or the second high frequency power supply 17 of the substrate processing apparatus 10, are controlled by a CPU of a controller (not illustrated) provided in the substrate processing apparatus according to a program corresponding to a dry etching process.

In the substrate processing apparatus 10, the shower head 23 is not in contact with the sidewall 13. Thus, a high frequency current caused by the plasma-generating power applied to the processing space PS flows through the shower head 23, the upper space US, the cover 14, and the sidewall 13 and reaches a ground. Here, since the bellows 31 has high impedance, a potential difference is generated between the shower head 23 and the cover 14. Therefore, an electric field may be generated in the upper space US (a second space) between the shower head 23 and the cover 14.

Figure 2:
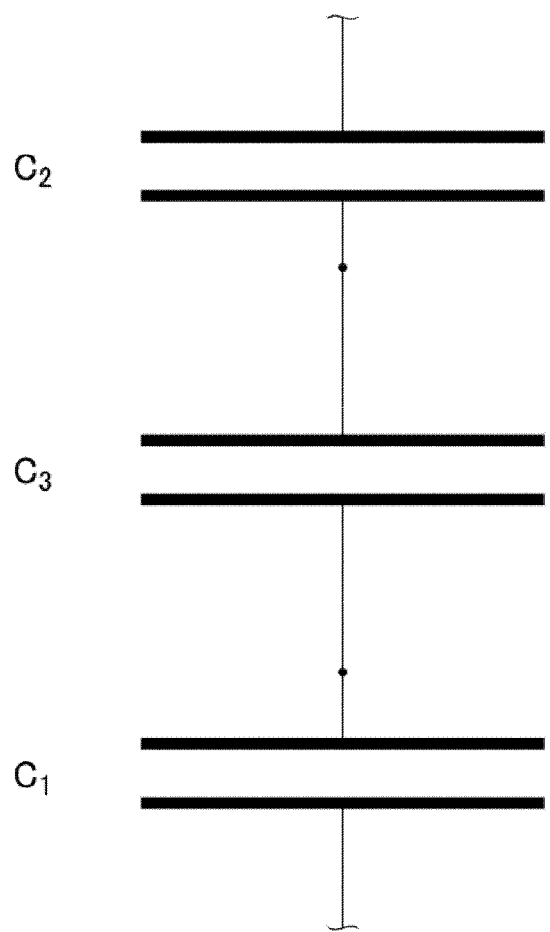
FIG. 2 is a view showing an electric circuit representing an upper space of the substrate processing apparatus of FIG. 1.

In accordance with the present embodiment, a voltage drop in the upper space US is reduced. To be specific, there is installed a first capacitor layer 32 made of a low dielectric constant material on the shower head 23's surface facing the upper space US, and there is installed a second capacitor layer 33 made of a low dielectric constant material on the cover 14's surface facing the upper space US. Here, the space between the shower head 23 and the cover 14 can be represented by an electrical series circuit of three capacitors as depicted in FIG. 2. A capacitor formed of the first capacitor layer 32 is denoted by $C_1$, a capacitor formed of the second capacitor layer 33 is denoted by $C_2$, and a capacitor formed of the upper space US is denoted by $C_3$. If a voltage drop at the capacitor $C_1$ or the capacitor $C_2$ is increased, a voltage drop at the capacitor $C_3$ can be relatively decreased, thereby reducing the potential difference in the upper space US.

Desirably, the first capacitor layer 32 and the second capacitor layer 33 may be made of a material having a dielectric constant of about 10 or less. Thus, the voltage drop to be shared by the first capacitor layer 32 or the second capacitor layer 33 can be appropriately adjusted. As a material of the first capacitor layer 32 or the like, it is possible to use an insulating resin such as polytetrafluoroethylene (PTFE), a copolymer of tetrafluoroethylene and perfluoroalkyl vinyl ether (PFA) or polychlorotrifluoroethylene (PCTFE); an engineering plastic-based resin; quartz ($SiO_2$); alumina ceramic ($Al_2O_3$); aluminum nitride (AlN); and silicon nitride (SiN). In particular, polytetrafluoroethylene, the copolymer of tetrafluoroethylene and perfluoroalkyl vinyl ether, and polychlorotrifluoroethylene have a high resistance to radicals. Therefore, even if plasma is introduced into the upper space US from the processing space PS, it is possible to prevent the first capacitor layer 32 or the second capacitor layer 33 from being eroded by using these materials having a high resistance to radicals.

In the substrate processing apparatus in accordance with the present embodiment, the first capacitor layer 32 and the second capacitor layer 33 are provided in the upper space US between the shower head 23 and the cover 14. Thus, a voltage drop related to a high frequency current caused by a high frequency power applied to the processing space PS and flowing through the shower head 23, the upper space US, the cover 14, and the sidewall 13 is shared by the first capacitor layer 32 and the second capacitor layer 33. Accordingly, a voltage drop in the upper space US can be reduced and a potential difference in the upper space US can be reduced. As a result, it is possible to suppress generation of an electric field in the upper space US and further suppress generation of plasma therein. Therefore, it is possible to prevent the cover 14 or the shower head 23 of the chamber 11 from being eroded and further prevent generation of deposits (particles) in the upper space US.

Further, in the substrate processing apparatus 10, the first capacitor layer 32 is installed on the shower head 23 and the second capacitor layer 33 is installed on the cover 14, and, thus, a configuration of the substrate processing apparatus 10 can be simplified. Therefore, the substrate processing apparatus 10 may be easily assembled.

Figure 3A:
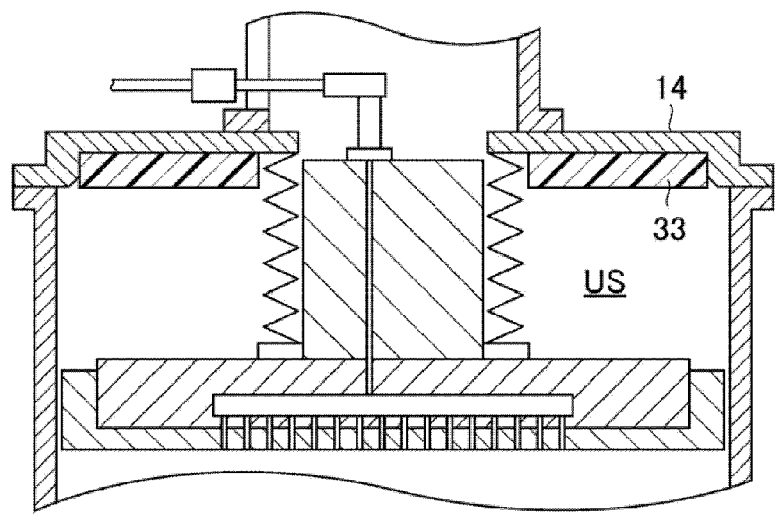
FIGS. 3A and 3B are schematic cross-sectional views of a first modified example and a second modified example of the substrate processing apparatus of FIG. 1, respectively.
Figure 3B:
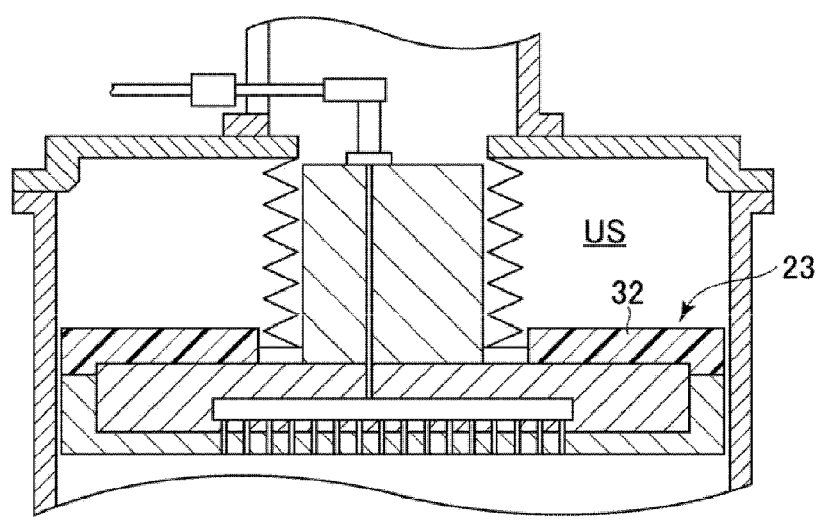

In the above-described substrate processing apparatus 10, two capacitor layers are provided in the upper space US, but the number of the capacitor layers is not limited. Even if there is installed one capacitor layer therein, the voltage drop can be shared by the capacitor layer, and, thus, at least one capacitor may be installed in the upper space US. For example, in the upper space US, only the second capacitor layer 33 may be provided on the cover 14 (see FIG. 3A), or only the first capacitor layer 32 may be provided on the shower head 23 (see FIG. 3B).

In the first embodiment, there has been explained a case where the shower head 23 moves and there exists the upper space US between the shower head 23 and the cover 14. However, in the case where the susceptor moves and there exists a lower space between the susceptor and a bottom wall of the chamber, at least one capacitor layer may be provided in the lower space, thereby suppressing generation of an electric field in the lower space and further suppressing generation of plasma therein.

Hereinafter, there will be explained a substrate processing apparatus in accordance with a second embodiment of the present invention.

The present embodiment is basically the same as the first embodiment in view of a configuration or an operation but different from the first embodiment only in that a low dielectric member is installed between a shower head and a sidewall of a chamber. Therefore, redundant description of the same will be omitted, but only different configuration and operation will be explained.

As described in the first embodiment, in a substrate processing apparatus including therein a movable shower head, the shower head is not in contact with a sidewall. However, in order to prevent plasma from introducing into an upper space from a processing space, a gap between the shower head (an upper electrode plate) and the sidewall is set to a minimum value and the conductive upper electrode plate becomes close to a sidewall in a ground potential. Since two objects having a high potential difference therebetween are close to each other, there is a risk of generation of abnormal electric discharge. In order to lower the risk, the upper electrode plate and the sidewall are separated from each other in the present embodiment.

Figure 4:
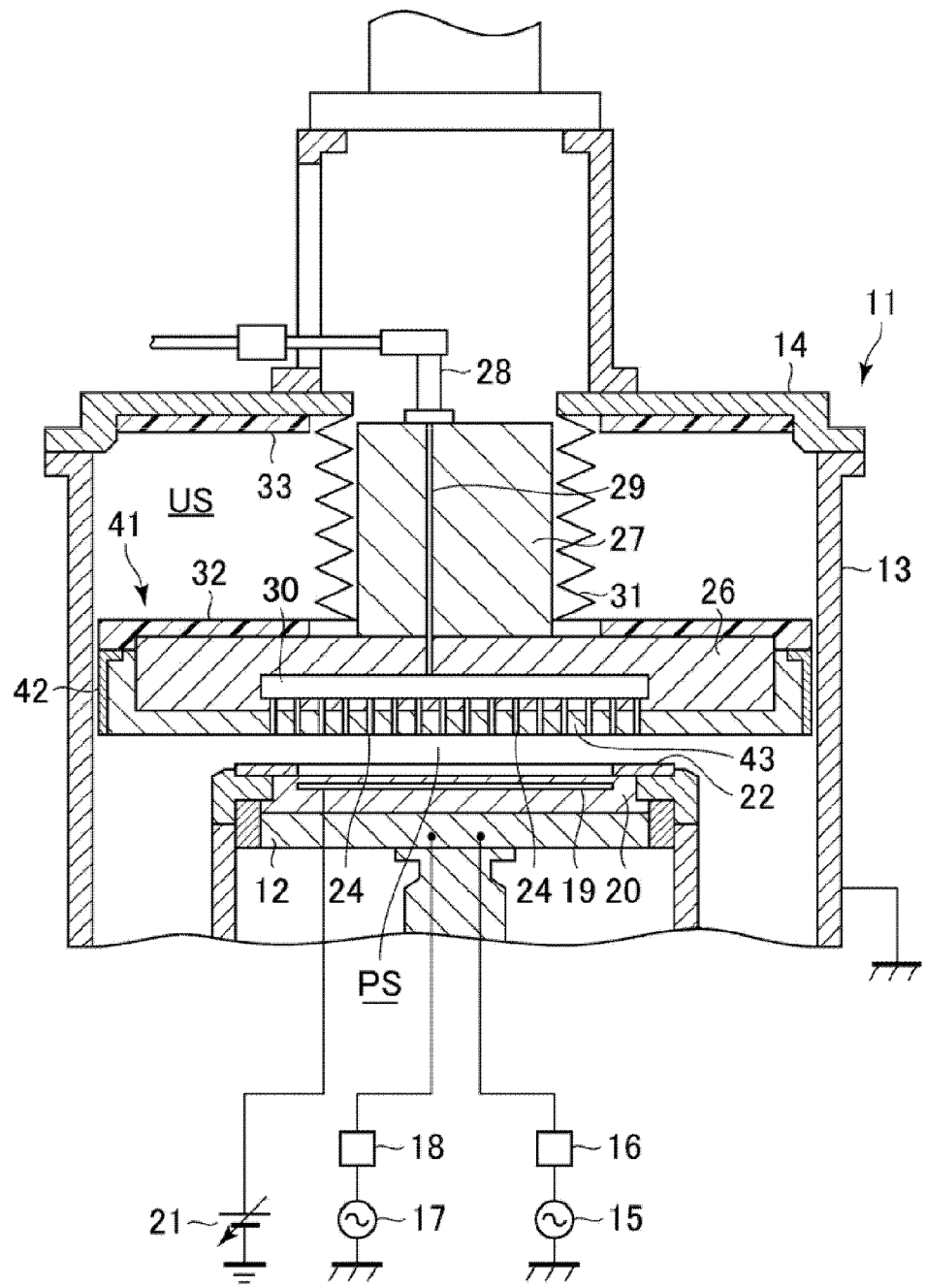
FIG. 4 is a schematic cross-sectional view of a substrate processing apparatus in accordance with a second embodiment of the present invention.

FIG. 4 is a schematic cross-sectional view of a substrate processing apparatus in accordance with the present embodiment.

As depicted in FIG. 4, a substrate processing apparatus 40 includes a shower head 41, and the shower head 41 includes a circular plate-shaped upper electrode plate 43 of which an outer periphery is surrounded by a dielectric ring (another dielectric member) 42; a cooling plate 26 attachably/detachably holding the upper electrode plate 43. The dielectric ring 42 is provided at the upper electrode plate 43 and has the thickness of about 5 mm or more in a direction from the shower head 41 to a sidewall 13. The dielectric ring 42 is configured to separate the upper electrode plate 43 from the sidewall 13. With this configuration, it is possible to prevent generation of abnormal electric discharge between the sidewall 13 and the shower head 41.

Further, a gap between the dielectric ring 42 and the sidewall 13 is set to be in the range from about 0.5 mm to about 3.0 mm. Thus, even if the dielectric ring 42 or the sidewall 13 is thermally expanded, they do not interfere with each other, and a gap between the sidewall 13 and the upper electrode plate 43 is almost filled with the dielectric ring 42. Accordingly, it is possible to prevent plasma generated in a processing space PS from introducing into an upper space US.

The upper electrode plate 43, the dielectric ring 42, and the sidewall 13 form a capacitor and are capacitively-coupled to each other to provide a small capacitance. Thus, a part of a high frequency current caused by a plasma-generating power applied to the processing space PS flows through the upper electrode plate 43, the dielectric ring 42, and the sidewall 13, and reaches a ground. That is, the high frequency current can be divided into one flowing through the upper space US and the other flowing through the dielectric ring 42. Accordingly, the high frequency current flowing through the upper space US can be decreased, thereby reducing a potential difference in the upper space US.

The dielectric ring 42 is exposed to plasma generated in the processing space PS, and, thus, a material of the dielectric ring 42 needs to have a resistance to ion-sputtering as well as a resistance to radicals. It is desirable to use quartz or a ceramic-based material such as alumina ceramic, aluminum nitride, silicon nitride, yttria ($Y_2O_3$), sapphire, and zirconia. It may be also possible to use an insulating resin such as polytetrafluoroethylene or an engineering plastic-based resin coated with a plasma-resistant material. Further, a dielectric constant of the dielectric ring 42 may be in a range from about 2 to about 30.

Figure 5:
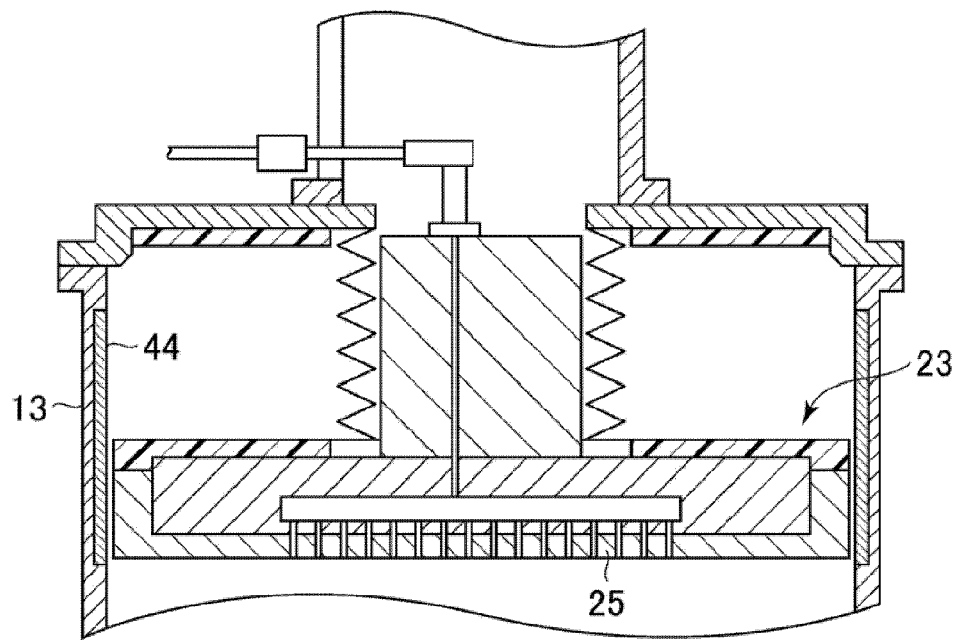
FIG. 5 is a schematic cross-sectional view of a modified example of the substrate processing apparatus of FIG. 4.

In the above-described substrate processing apparatus 40, although the dielectric ring 42 is installed at an outer periphery of the upper electrode plate 43, as depicted in FIG. 5, a cylindrical dielectric member 44 may be installed at a sidewall 13 instead of the dielectric ring 42. In this case, the dielectric member 44 separates an upper electrode plate 25 from the sidewall 13, and, thus, it is possible to prevent generation of abnormal electric discharge between the sidewall 13 and a shower head 23.

Further, in the second embodiment, there has been explained a case where the shower head 41 moves and there exists a gap between the shower head 41 and the sidewall 13. However, in the case where a susceptor moves and there exists a gap between the susceptor and the sidewall 13, by installing a dielectric member to fill the gap, it is possible to prevent generation of abnormal electric discharge between the sidewall 13 and the susceptor.

Hereinafter, there will be explained an experimental example of the present invention.

Experimental Example

In the substrate processing apparatus 10, the first capacitor layer 32 was formed by stacking two Teflon (registered trademark) sheets each having the thickness of about 1 mm; the second capacitor layer 33 was formed of one Teflon (registered trademark) sheet having a thickness of about 1 mm; a plasma-generating power having a predetermined value was applied to the processing space PS without applying a bias power thereto; and a thickness of the processing space PS (gap) was set to a predetermined value. Then, it was checked whether or not plasma was generated in the upper space US. A result thereof is shown in Table 1 below.

TABLE 1

| Plasma-generating power (W) | Gap thickness (mm) | | |
|---|---|---|---|
| | 15 | 40 | 85 |
| 500 | ○ | ○ | ○ |
| 1000 | ○ | ○ | ○ |
| 1500 | ○ | ○ | ○ |
| 2000 | ○ | ○ | ○ |
| 2500 | ○ | ○ | ○ |

The mark "○" in Table 1 represents that plasma is not generated.

Comparative Example

In the substrate processing apparatus 10, the capacitor layer in the upper space US was not installed; a plasma-generating power having a predetermined value was applied to the processing space PS without applying a bias power thereto; a thickness of the processing space PS (gap) was set to a predetermined value. Then, it was checked whether or not plasma was generated in the upper space US. A result thereof is shown in Table 2 below.

TABLE 2

| Plasma-generating power (W) | Gap thickness (mm) | | |
|---|---|---|---|
| | 15 | 40 | 85 |
| 500 | Δ | ○ | ○ |
| 1000 | ○ | ○ | X |
| 1500 | Δ | ○ | X |
| 2000 | ○ | X | X |
| 2500 | X | X | X |

The mark "X" in Table 2 represents that plasma is generated, the mark "Δ" represents that plasma is sometimes generated, and the mark "○" represents that plasma is not generated.

As can be seen from comparison of Table 1 and Table 2, it is possible to securely prevent generation of plasma by installing the first capacitor layer 32 and the second capacitor 33 in the upper space US.

Hereinafter, there will be explained a substrate processing apparatus in accordance with a third embodiment of the present invention.

In this substrate processing apparatus, an electrostatic coupling is formed between a movable electrode and a cylindrical shaped chamber's sidewall facing the movable electrode. Further, a ground path of a high frequency current caused by a high frequency power applied to a susceptor includes a line (hereinafter, referred to as "first ground path") to be grounded along the movable electrode, an upper space US, and a cover and a sidewall of the chamber and a line (hereinafter, referred to as "second ground path") to be grounded along the movable electrode and the sidewall of the chamber. Furthermore, a capacitance distribution ratio of the ground paths is changed according to movement of the movable electrode.

In a substrate processing apparatus performing a predetermined plasma process onto a wafer, multiple plasma processes may be consecutively performed as a batch process in one chamber. Here, since a processing condition, particularly an optimum position of a shower head serving as a movable electrode, is different in each process, an optimum gap is set for each process. In such a batch process, whenever the gap is changed, desirably, optimization of plasma distribution in a processing space PS may be required, and, thus, there has been a demand for development in a technology of increasing parameters for optimizing the plasma distribution.

To satisfy such a demand, the present embodiment provides a substrate processing apparatus capable of optimizing plasma distribution in a processing space according to a change in a gap.

In accordance with the present embodiment, there is provided a substrate processing apparatus including a cylindrical shaped chamber configured to accommodate a substrate, a movable electrode capable of moving along a central axis of the cylindrical shaped chamber within the cylindrical shaped chamber, a facing electrode facing the movable electrode within the cylindrical shaped chamber, and an expansible/contractible partition wall connecting the movable electrode with an end wall on one side of the cylindrical shaped chamber. Further, a high frequency power is applied to a first space between the movable electrode and the facing electrode and a processing gas is introduced thereto. Furthermore, the movable electrode is not in contact with a sidewall of the cylindrical shaped chamber, and a first dielectric member is provided at the cylindrical shaped chamber's sidewall facing the movable electrode, and an overlap area between the first dielectric member and a side surface of the movable electrode is changed according to movement of the movable electrode.

Figure 6:
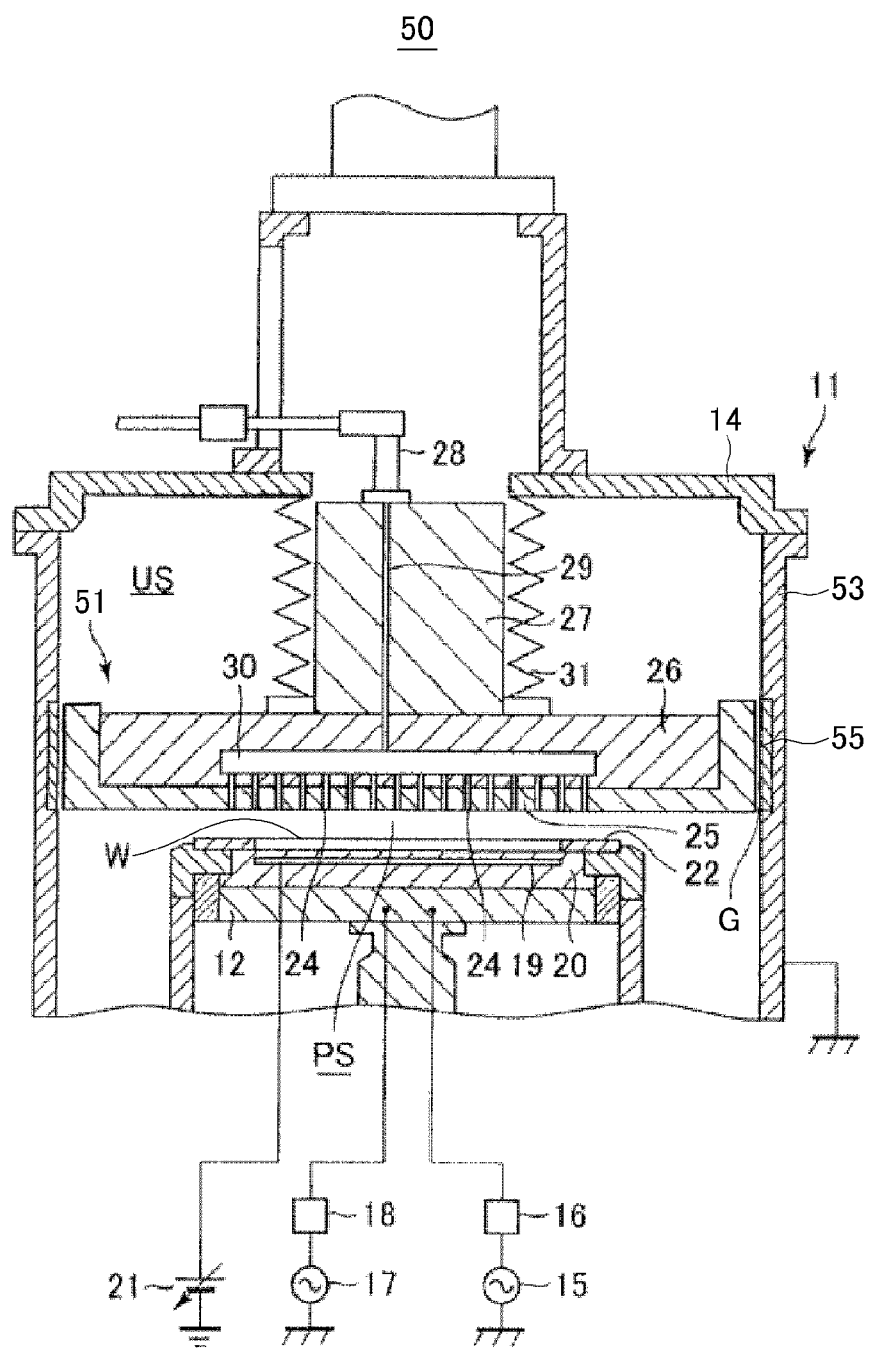
FIG. 6 is a schematic cross-sectional view of a substrate processing apparatus in accordance with a third embodiment of the present invention.

FIG. 6 is a schematic cross-sectional view of a substrate processing apparatus in accordance with a third embodiment of the present invention.

In FIG. 6, a basic configuration of a substrate processing apparatus 50 is the same as that of the substrate processing apparatus (see FIG. 1) in accordance with the first embodiment. Therefore, redundant description of the same will be omitted and the present embodiment will be explained below focusing on different configuration and operation.

In a substrate processing apparatus, plasma distribution in a processing space PS of a chamber is affected by, e.g., a gap, a pressure within the chamber, a kind of a processing gas, and an application value of a high frequency power.

The substrate processing apparatus in accordance with the present embodiment is provided to obtain plasma distribution. Here, a basic processing condition, which is determined by a process purpose but cannot be modified in order to achieve the process purpose, is maintained as it is and other processing conditions more appropriate for the process are set in addition to such a basic condition. In order to do so, a dielectric member is provided at a sidewall of the cylindrical shaped chamber, and an electrostatic coupling is formed between the sidewall of the chamber, the dielectric member provided at this sidewall, and a movable electrode facing thereto. In this case, an electrostatic capacitance of the electrostatic coupling is changed according to movement of the movable electrode. Therefore, a capacitance of the second ground path and a capacitance distribution ratio between the second ground path and the first ground path are changed, so that plasma distribution in the processing space PS can be optimized.

The substrate processing apparatus 50 is different from the substrate processing apparatus 10 of FIG. 1 in that the first capacitor layer 32 and the second capacitor layer made of a low dielectric constant material on the surfaces facing the upper space US are omitted and a first dielectric member 55 is installed at a chamber 11's sidewall 53 facing a shower head 51 serving as a movable electrode.

That is, the substrate processing apparatus 50 includes the cylindrical-shaped chamber (cylindrical shaped vessel) 11 and the shower head (movable electrode) 51 which can be moved along a central axis of the chamber 11, and the first dielectric member 55 is installed at the chamber 11's sidewall 53 facing the shower head 51.

The first dielectric member 55 is of a ring shape and inserted and fitted into a ring-shaped recess of a predetermined depth installed at the sidewall 53 of the cylindrical chamber 11. A cross section of the first dielectric member 55 along the central axis of the chamber 11 has, for example, a rectangular shape. Therefore, the first dielectric member 55's width (hereinafter, referred to as "thickness") in a direction toward the central axis of the chamber 11 is constant along the central axis of the chamber 11. The first dielectric member 55 faces a side surface of the shower head 51 with a gap G therebetween and an overlapped area sandwiching the gap G (hereinafter, simply referred to as "overlap area") is changed according to movement of the shower head 51.

Further, in FIG. 6, a length of the first dielectric member 55 along the central axis of the chamber 11 is the same as a thickness of the shower head 51 but it is not limited thereto. The length of the first dielectric member 55 can be appropriately selected.

FIGS. 7A to 7D are schematic diagrams showing overlap statuses between the shower head 51 and the first dielectric member 55 of FIG. 6.

In FIGS. 7A to 7D, in a status where the shower head 51 is at the lowermost position in a range of a vertical movement of the shower head 51, i.e., in a status with the smallest gap (see FIG. 7A), an overlap area between the first dielectric member 55 and the shower head 51 becomes largest. If this area is defined as 1.0, in a status where the shower head 51 arrives at the middle point between the lowermost position and the uppermost position (see FIG. 7B) by gradually moving upward, an overlap area becomes 0.5. Further, in a status where the shower head 51 arrives at the uppermost position (see FIG. 7C), an overlap area becomes 0.

Figure 7A:
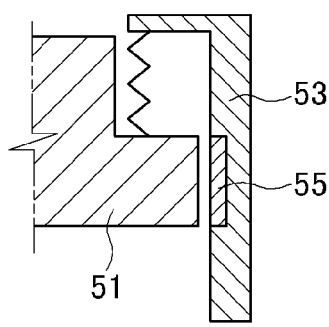
FIGS. 7A to 7D are schematic diagrams showing overlap statuses between a shower head and a first dielectric member of FIG. 6.
Figure 7B:
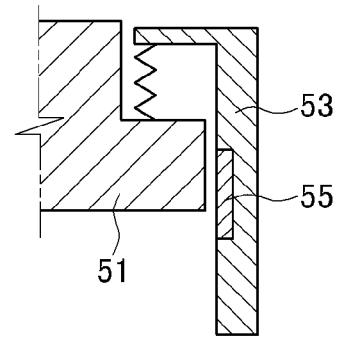
Figure 7C:
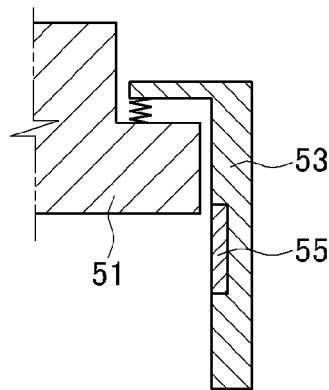
Figure 7D:
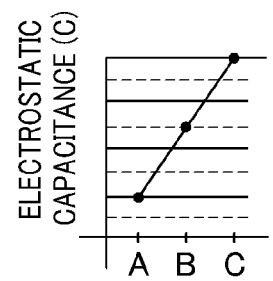

FIG. 7D is a view showing a change of electrostatic capacitance of the electrostatic coupling between the shower head 51, the first dielectric member 55, and the sidewall 53 of the chamber 11. In FIG. 7D, the electrostatic capacitance varies depending on a position of the shower head 51. That is, as the shower head 51 moves upward, the electrostatic capacitance gradually increases.

In accordance with the present embodiment, the ring-shaped first dielectric member 55 is provided at the chamber 11's sidewall 53 facing the shower head 51 and the overlap area between the first dielectric member 55 and the side surface of the shower head 51 is changed according to movement of the shower head 51. Accordingly, the electrostatic capacitance of the electrostatic coupling between the shower head 51, the first dielectric member 55, and the sidewall 53 of the chamber 11 is changed according to movement of the shower head 51. Therefore, the capacitance of the second ground path flowing through the shower head 51, the sidewall 53 of the chamber 11 to the ground is changed. Further, if the capacitance of the second ground path is changed, the capacitance distribution ratio between the second ground path and the first ground path is changed and, particularly, a value of a high frequency current flowing through a peripheral end portion of the shower head 51 is changed, and, thus, plasma distribution in the processing space PS becomes changed.

Accordingly, a capacitance distribution ratio between the first ground path and the second ground path for obtaining a required plasma distribution in a first processing space PS is calculated with respect to a gap in each plasma process. Then, a position at the sidewall 53 of the chamber 11, a shape of a cross section, and a thickness of the first dielectric member 55 for obtaining the calculated ratio are calculated with respect to a gap in each plasma process. Then, the appropriate first dielectric member 55 is provided at the appropriate position, so that plasma distribution in the processing space PS can be optimized depending on different processing conditions for different processing purposes.

By optimizing the plasma distribution in the first processing space PS, in-plane uniformity of an etching rate can be expected.

In the present embodiment, a ring-shaped second dielectric member may be further provided at the shower head 51's side surface facing the first dielectric member 55. In this case, an overlap area between the first dielectric member 55 and the second dielectric member may be changed according to movement of the shower head 51. Accordingly, a range of a change in the electrostatic capacitance of the electrostatic coupling depending on movement of the shower head 51 becomes narrower, and, thus, plasma distribution in the processing space PS according to a change in the gap can be more finely adjusted.

Further, in this case, cross sections of the first dielectric member 55 and the second dielectric member along the central axis of the chamber 11 may have a rectangular shape or a triangular shape and a thickness in a direction orthogonal to the central axis may be constant or gradually changed along the central axis. By arbitrarily combining shapes of the cross sections of the first dielectric member 55 and the second dielectric member along the central axis of the chamber 11, the capacitance of the second ground path according to the change in the gap can be varied. Therefore, a variation of the electrostatic coupling is increased in the third embodiment.

In the present embodiment, each of the first dielectric member 55 and the second dielectric member may be made of quartz, ceramic or an insulating resin. Since these materials have a resistance to ion-sputtering as well as a resistance to radicals, the first dielectric member 55 and the second dielectric member can be prevented from being eroded by plasma generated in the first processing space PS. The ceramic-based material may include, for example, alumina ceramic, aluminum nitride, silicon nitride, yttria ($Y_2O_3$), sapphire, and zirconia, and the insulating resin may include, for example, polytetrafluoroethylene.

In the above-described third embodiment, it has been described that the shower head 51 moves, but the susceptor 12 may be moved. In this case, the first dielectric member is provided at the chamber 11's sidewall 53 facing a sidewall of the susceptor 12, and an electrostatic coupling is formed between the susceptor 12, the first dielectric member 55, and the sidewall 53 of the chamber 11. Accordingly, an overlap area between the susceptor 12 and the first dielectric member 55 is changed according to movement of the susceptor 12. Therefore, an electrostatic capacitance of the electrostatic coupling is changed, so that plasma distribution in the first processing space PS can be optimized.

FIGS. 8A to 11D show modified examples of an electrostatic coupling between the shower head 51, the first dielectric member 55, and the sidewall 53 of the chamber 11 in the third embodiment.

As depicted in FIGS. 8A to 8D, in an electrostatic coupling forming a second ground path, a first dielectric member 65 is provided at a sidewall 63 of a chamber 11 and has a rectangular cross section along an central axis of the chamber 11 and serves as a part of a dielectric member of a capacitor in the same manner as illustrated in FIGS. 7A to 7D.

Figure 8A:
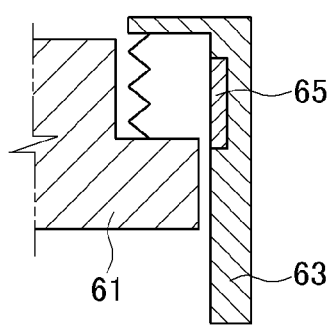
FIGS. 8A to 8D are views of a modified example of an electrostatic coupling between a shower head, a dielectric member, and a sidewall of a chamber in the third embodiment.
Figure 8B:
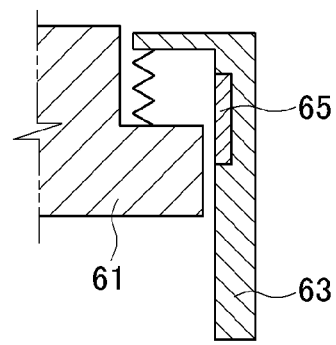
Figure 8C:
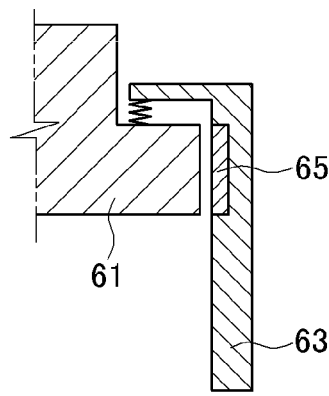
Figure 8D:
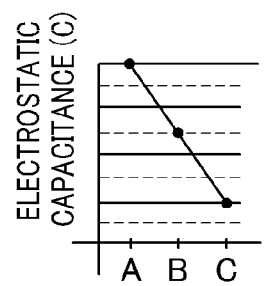

In a status where a shower head 51 is at the lowermost position (see FIG. 8A), an overlap area between the shower head 61 and the first dielectric member 65 becomes 0. In a status where the shower head 61 arrives at the middle point between the lowermost position and the uppermost position (see FIG. 8B) by gradually moving upward, an overlap area between the shower head 61 and the first dielectric member 65 becomes 0.5 times of an overlap area when they face each other with full overlap (see FIG. 8C). Further, in a status where the shower head 61 arrives at the uppermost position (see FIG. 8C), the shower head 61 and the first dielectric member 65 face each other with full overlap and an overlap area becomes largest. In this case, as depicted in FIG. 8D, an electrostatic capacitance becomes gradually decreased in a sequence of FIGS. 8A, 8B, and 8C. As the electrostatic capacitance is changed, a capacitance of the second ground path flowing through the sidewall 63 of the chamber 11 to a ground is changed. Therefore, a value of a high frequency current flowing through a peripheral end portion of the shower head 61 is changed, so that plasma distribution in the processing space PS becomes optimized.

Figure 9A:
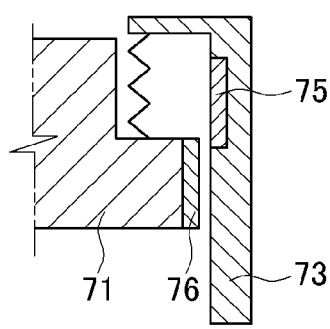
FIGS. 9A to 9D are views of another modified example of an electrostatic coupling between a shower head, a dielectric member, and a sidewall of a chamber in the third embodiment.
Figure 9B:
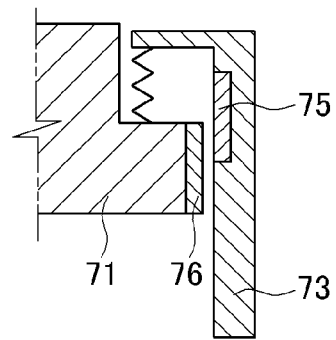
Figure 9C:
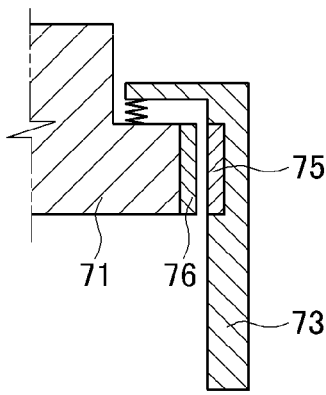
Figure 9D:
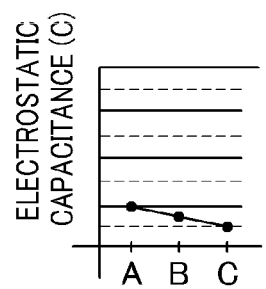
Figure 10A:
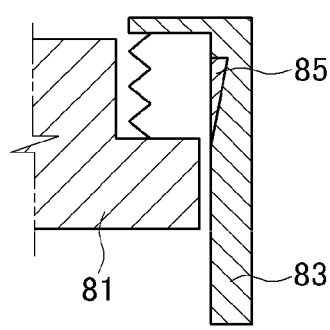
FIGS. 10A to 10D are views of still another modified example of an electrostatic coupling between a shower head, a dielectric member, and a sidewall of a chamber in the third embodiment.
Figure 10B:
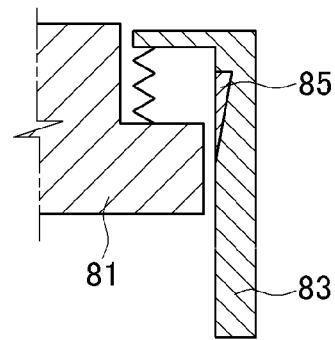
Figure 10C:
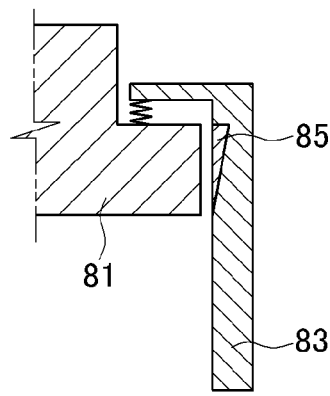
Figure 10D:
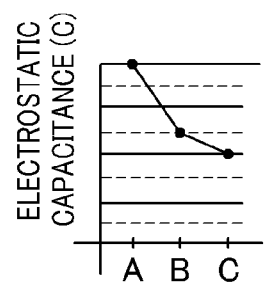
Figure 12:
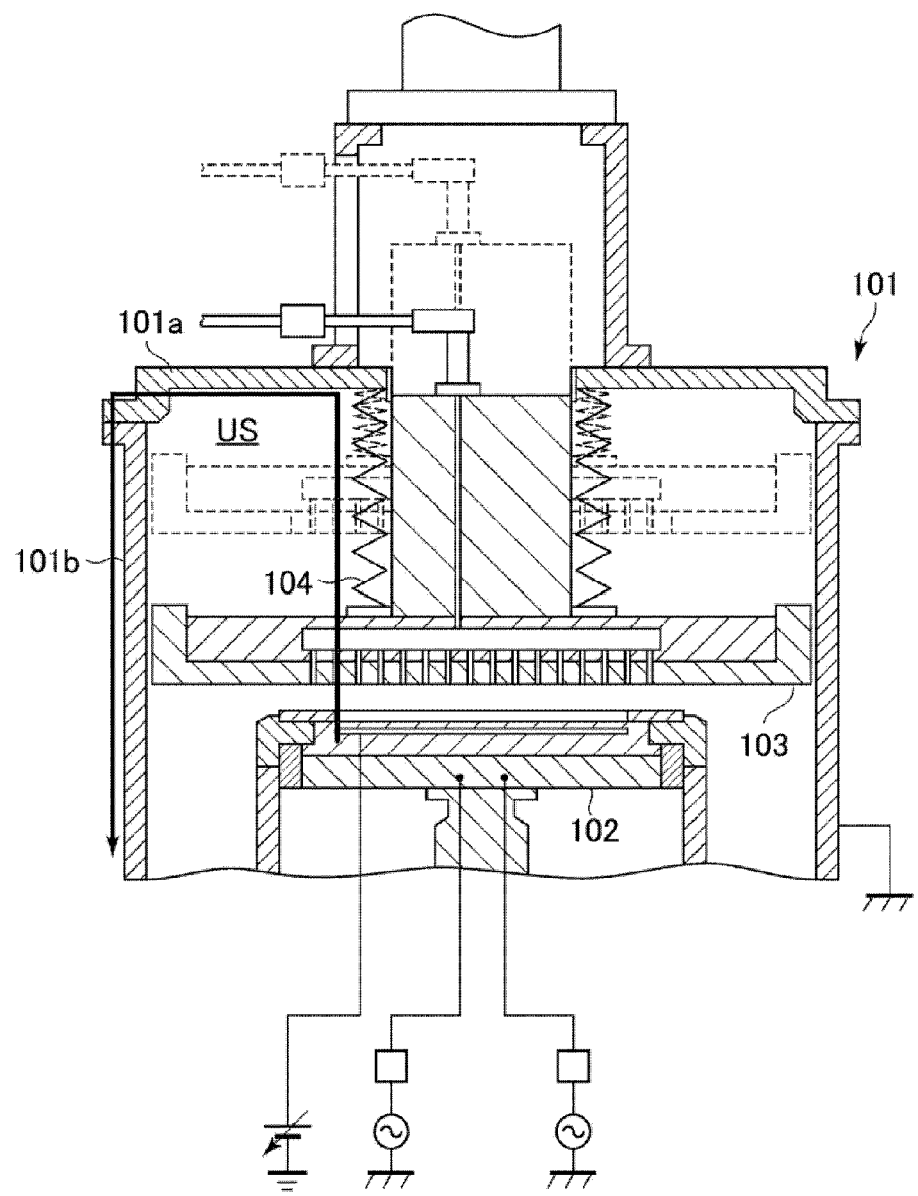
FIG. 12 is a schematic cross-sectional view of a substrate processing apparatus including a movable shower head.

FIGS. 9A to 9D show that a second dielectric member 76 is provided at a side surface of a shower head 71 in addition to a first dielectric member 75 and an overlap area between the first dielectric member 75 and the second dielectric member 76 is changed in the same manner as illustrated in FIGS. 8A to 8D. In this modified example, as depicted in FIG. 9D, an electrostatic capacitance of an electrostatic coupling forming a second ground path is decreased in a sequence of FIGS. 9A, 9B, and 9C, but each value of the electrostatic capacitance and a decreasing rate are lower than those of FIGS. 8A to 8D.

In FIGS. 10A to 10D, there has been employed a first dielectric member 85 having a right triangular cross section instead of the first dielectric member of FIGS. 8A to 8D. The right triangular cross section has a half area of a cross section area of the first dielectric member along the central axis of the chamber 11 and has a thickness which is gradually decreased toward the lower side FIGS. 10A to 10D. In this modified example, an overlap area between the first dielectric member 85 and a side surface of a shower head 81 is changed in the same manner as illustrated in FIGS. 8A to 8D. However, since the thickness of the first dielectric member 85 is decreased toward the lower side, an electrostatic capacitance of an electrostatic coupling forming a second ground path is decreased in a sequence of FIGS. 10A, 10B, and 10C and a decrease amount is greatly changed in a curve shape.

Further, in FIGS. 11A to 11D, there have been employed first and second dielectric members 95 and 96 each having a right triangular cross section as shown in FIGS. 10A to 10D instead of the first and second dielectric members of FIGS. 9A to 9D. In this modified example, as depicted in FIG. 11D, an electrostatic capacitance of an electrostatic coupling forming a second ground path is decreased in a sequence of FIGS. 11A, 11B, and 11C and a decrease amount is changed in a curve shape.

In accordance with the modified examples of the present embodiment, depending on a change in a gap caused by movement of a shower head serving as a movable electrode, a position, a shape of a cross section, and a thickness of an appropriate dielectric member are selected and, then, the dielectric member is provided at the selected position.

Accordingly, plasma distribution in the first processing space PS for each plasma process condition can be optimized and a capacitance distribution ratio of a ground path may be added to parameters for adjusting the plasma distribution.

What is claimed is:

1. A substrate processing apparatus comprising:
   a cylindrical shaped chamber configured to accommodate a substrate, including a sidewall and a cover;
   a movable electrode capable of moving along a central axis of the cylindrical shaped chamber within the cylindrical shaped chamber, the movable electrode being an upper electrode;
   a facing electrode facing the movable electrode within the cylindrical shaped chamber, the facing electrode being a lower electrode; and
   an expansible/contractible partition wall connecting the movable electrode with an end wall on one side of the cylindrical shaped chamber,
   wherein a high frequency power is applied to a first space between the movable electrode and the facing electrode, a processing gas is introduced thereto, and the movable electrode is not in contact with the sidewall of the cylindrical shaped chamber,
   a first low dielectric member is installed on a top surface of the movable electrode facing a second space between the movable electrode and the cover of the cylindrical shaped chamber, and a second low dielectric member is installed on a bottom surface of the cover facing the second space,
   a voltage drop at the second space caused by the high frequency power is adjusted by the first low dielectric member and the second low dielectric member to suppress generation of plasma in the second space,
   the second low dielectric member is formed of a plate shaped member, and the first low dielectric member is formed by stacking two sheets of the plate shaped member, and
   the voltage drop at the second space is decreased by increasing a voltage drop at the first low dielectric member or by increasing a voltage drop at the second low dielectric member, thereby reducing a potential difference in the second space.

2. The substrate processing apparatus of claim 1, wherein a dielectric constant of each of the first low dielectric member and the second low dielectric member is about 10 or less.

3. The substrate processing apparatus of claim 2, wherein each of the first low dielectric member and the second low dielectric member is made of polytetrafluoroethylene (PTFE), a copolymer of tetrafluoroethylene and perfluoroalkyl vinyl ether (PFA) or polychlorotrifluoroethylene (PCTFE).

4. The substrate processing apparatus of claim 1, wherein another dielectric member is further installed between the sidewall of the cylindrical shaped chamber and the movable electrode.

5. The substrate processing apparatus of claim 4, wherein a thickness of the another dielectric member is equal to or greater than about 5 mm in a direction from the movable electrode to the sidewall.

6. The substrate processing apparatus of claim 4, wherein the another dielectric member is made of ceramic.

7. The substrate processing apparatus of claim 4, wherein the another dielectric member is installed at the movable electrode.

8. The substrate processing apparatus of claim 4, wherein the another dielectric member is installed at the sidewall.

9. The substrate processing apparatus of claim 1, wherein the plate shaped member has a thickness of about 1 mm.

* * * * *

UNITED STATES PATENT AND TRADEMARK OFFICE
CERTIFICATE OF CORRECTION

| | | |
|---|---|---|
| PATENT NO. | : 8,852,390 B2 | Page 1 of 1 |
| APPLICATION NO. | : 12/748702 | |
| DATED | : October 7, 2014 | |
| INVENTOR(S) | : Daisuke Hayashi | |

It is certified that error appears in the above-identified patent and that said Letters Patent is hereby corrected as shown below:

In the specification,

Column 7, line 66, please add -- 31 -- between "bellows" and "is"

Column 13, line 3, please add -- 33 -- between "layer" and "made"

Column 14, line 54, please add -- 55 -- between "member" and "is"

Signed and Sealed this
Twenty-second Day of December, 2015

Michelle K. Lee
*Director of the United States Patent and Trademark Office*